(12) United States Patent
Oh et al.

(10) Patent No.: US 9,006,631 B2
(45) Date of Patent: Apr. 14, 2015

(54) IMAGE SENSOR AND ROW AVERAGING METHOD FOR IMAGE SENSOR

(75) Inventors: Hack Soo Oh, Seoul (KR); Jeongmi Kwon, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 308 days.

(21) Appl. No.: 13/368,633

(22) Filed: Feb. 8, 2012

(65) Prior Publication Data

US 2013/0082164 A1    Apr. 4, 2013

(30) Foreign Application Priority Data

Oct. 4, 2011 (KR) .................. 10-2011-0100722

(51) Int. Cl.
*H01L 27/00* (2006.01)
*H04N 5/347* (2011.01)
*H01L 27/146* (2006.01)
*H04N 5/372* (2011.01)
*H04N 5/378* (2011.01)

(52) U.S. Cl.
CPC .......... *H04N 5/347* (2013.01); *H01L 27/14641* (2013.01); *H04N 5/37213* (2013.01); *H04N 5/378* (2013.01)

(58) Field of Classification Search
CPC ....... H04N 5/341; H04N 5/347; H04N 5/357; H01L 27/146; H01L 27/14609
USPC .................. 250/208.1, 214 P, 214 R, 214 SW; 348/272, 281, 302, 304, 308, 312, 348/E3.02
See application file for complete search history.

(56) References Cited

U.S. PATENT DOCUMENTS

| | | | |
|---|---|---|---|
| 6,895,256 B2 * | 5/2005 | Harma et al. | ............... 455/556.1 |
| 7,319,218 B2 | 1/2008 | Krymski | |
| 7,554,584 B2 | 6/2009 | Lim | |
| 2002/0139921 A1 * | 10/2002 | Huang et al. | ............... 250/208.1 |
| 2005/0103977 A1 | 5/2005 | Krymski | |
| 2005/0206752 A1 | 9/2005 | Lim | |
| 2006/0187328 A1 | 8/2006 | Lim | |
| 2007/0018072 A1 | 1/2007 | Koh et al. | |

FOREIGN PATENT DOCUMENTS

| | | |
|---|---|---|
| KR | 10-2005-0092579 | 9/2005 |
| KR | 10-2006-0093911 | 8/2006 |
| KR | 10-2006-0101531 | 9/2006 |
| KR | 10-0660869 | 12/2006 |
| KR | 10-0790583 B1 | 1/2008 |
| KR | 10-0817836 | 3/2008 |
| KR | 10-0994993 | 11/2010 |

* cited by examiner

*Primary Examiner* — Kevin Pyo
(74) *Attorney, Agent, or Firm* — Andrew D. Fortney; Central California IP Group, P.C.

(57) ABSTRACT

An image sensor and a row averaging method for an image sensor capable of simultaneously selecting the pixels of the same color in the same column of different rows in a pixel array and performing a signal process, thereby preventing an increase in an area and a decrease in the sensing speed of the pixels in the sub-sampling mode and the binning mode of the image sensor.

18 Claims, 4 Drawing Sheets

IMAGE SENSOR AND ROW AVERAGING METHOD FOR IMAGE SENSOR

The present invention claims priority to Korean Patent Application No. 10-2011-0100722 (filed on Oct. 4, 2011), which is hereby incorporated by reference in its entirety.

BACKGROUND

In an image sensor, in particular, a. CMOS (Complementary Metal-Oxide Semiconductor) image sensor, each frame is constituted by N×M unit pixels. When the image sensor is operating in a low-resolution mode, the outputs of only some of the unit pixels, not all the unit pixels, are sent.

The low-resolution mode in which the image sensor operates includes a sub-sampling mode and a binning mode.

For example, when the image sensor is operating with a resolution which is a quarter of the full resolution, it should suffice that only the outputs of the N/2×M/2 pixels from among all the N×M pixels are sent. In the sub-sampling mode, an operation is performed such that the outputs of the N/2 row pixels are sent, and the outputs of the remaining N/2 row pixels are not sent. Meanwhile, in the binning mode, the outputs of pixels of the same color in two adjacent pixels are added and output as a single pixel output value. In the binning mode, there is no pixel output value to be discarded, so that an image is formed using all the pixel output values, thereby obtaining a high-quality image as compared to the sub-sampling mode.

Figure 1:
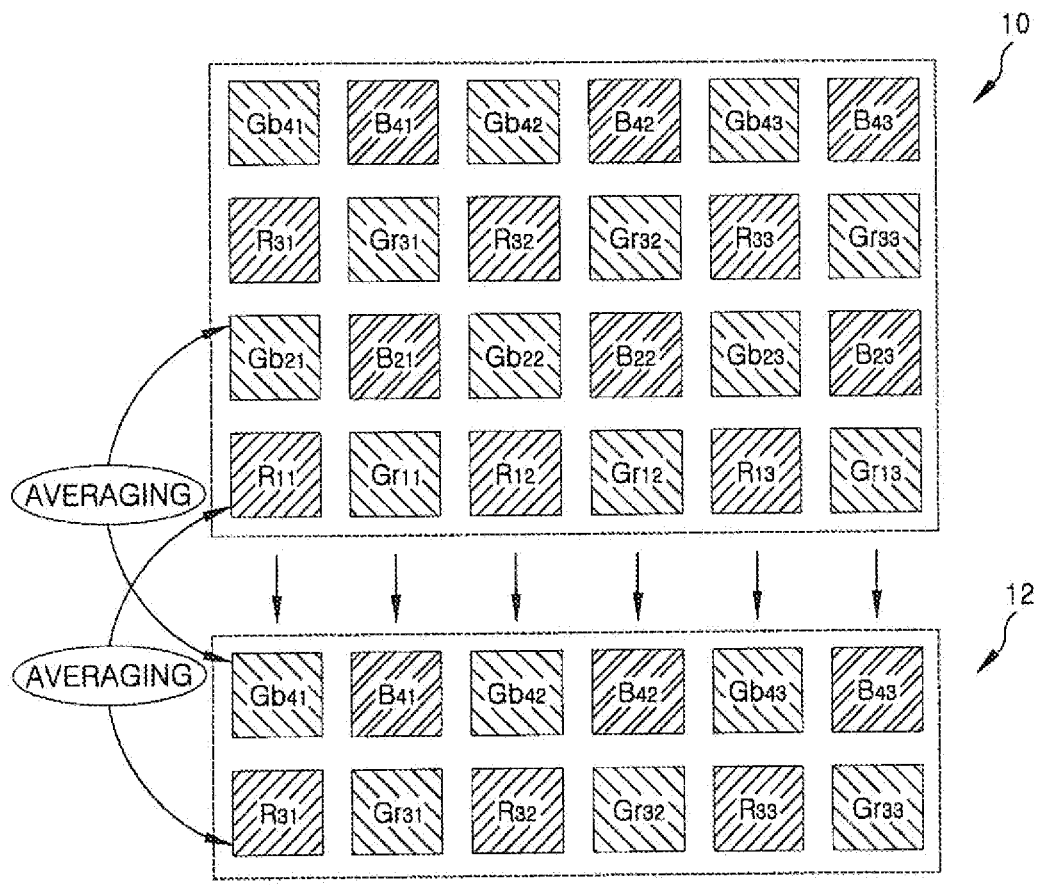

FIG. 1 illustrates the sub-sampling mode and the binning mode.

As illustrated in FIG. 1, in the sub-sampling mode, only pixel information of the pixels in the first and second rows from among the pixels in the four total rows of the pixel array 10 can be output, for example, only pixel information of Gb41-B41-Gb42-B42-Gb43-B43 and R31-Gr31-R32-Gr32-R33-Gr33 can be output.

In order to minimize noise for the pixel information to be read in the sub-sampling mode, the binning mode may be executed in which the read pixel information and unread pixel information of the pixels in the third and fourth rows, for example, pixel information of Gb21-B21-Gb22-B22-Gb23-B23 and R11-Gr11-R12-Gr12-R13-Gr13 are added (averaged).

At this time, in the sub-sampling mode and the binning mode of the whole pixel array, the pixel information of Gb41-B41-Gb42-B42-Gb43-B43 of the first row is temporarily stored in a line memory 12 and added to the pixel information of Gb21-B21-Gb22-B22-Gb23-B23 of the third row having the same color arrangement as the pixel information of the first row, and averaging is performed. Next, the pixel information of R31-Gr31-R32-Gr32-R33-Gr33 of the second row is temporarily stored in the line memory 12 and added to the pixel information of R11-Gr11-R12-Gr12-R13-Gr13 of the fourth row having the same color arrangement as the pixel information of the second row, and averaging is performed.

In the image sensor of the related art, since it is necessary to store previous information so as to obtain an average in the sub-sampling mode and the binning mode, there is a need for the additional line memory 12, and it is necessary to separately read pixel information of two rows for obtaining an average two times.

This leads to an increase in a whole memory area and a decrease in the sensing timing of the pixels to be equal to or lower than 50%.

SUMMARY

In view of the above, embodiments relate to an image sensor and a row averaging method for an image sensor capable of preventing an increase in an area and a decrease in the sensing speed of pixels in a sub-sampling mode and a Binning mode.

Embodiments also relate to an image sensor and a row averaging method for an image sensor capable of simultaneously selecting the pixels of the same color in the same column of different rows in a pixel array and performing a signal process, thereby preventing an increase in a memory area and a decrease in a sensing speed in the sub-sampling mode and the binning mode of an image sensor.

In accordance with embodiments, there is provided an image sensor having a pixel array with a plurality of pixels arranged in rows and columns. The image sensor may include light-receiving units which are respectively formed in the pixels in the pixel array, a signal processing unit for reading pixel signals generated by the light-receiving units and performs a signal process, and a timing control unit controlling the switching timing of the signal processing unit such that pixels of the same color in the same column of different rows in the pixel array may be simultaneously selected and subjected to the signal process.

The average value of the signals of the pixels of the same color may be output through the signal processing unit.

The timing control unit may perform control such that selection transistors of different rows may be turned on to select different rows, reset transistors of the pixels in the same column may be simultaneously turned on/off to simultaneously initialize the pixels in the same column of different rows, and transfer transistors of the pixels in the same column may be simultaneously turned on/off to simultaneously transfer the signals of the pixels in the same column to a signal detection unit.

The signal processing unit may include selection transistors for simultaneously selecting different rows having the same color arrangement in the pixel array, reset transistors for simultaneously initializing the pixels in the same column of different rows to be selected, and transfer transistors for simultaneously transferring the signals of the pixels in the same column to a signal detection unit in the corresponding column.

The timing control unit may perform control such that selection transistors of different rows may be simultaneously turned on to select different rows, reset transistors of the pixels in the same column may be simultaneously turned on/off to simultaneously initialize the pixels in the same column of different rows, and transfer transistors of the pixels in the same column may be simultaneously turned on/off to simultaneously transfer the signals of the pixels in the same column to a signal detection unit.

In accordance with embodiments, there is provided a row averaging method for an image sensor. The row averaging method may include simultaneously performing a signal process on the signals of the pixels of the same color in the same column of different rows in the pixel array and outputting the average value of the signals of the pixels.

In embodiments, outputting the average value may include simultaneously selecting different rows having the same color arrangement in the pixel array.

Further, outputting the average value may include simultaneously initializing the pixels in the same column of different rows and/or simultaneously outputting the signals of the pixels in the same column of different rows.

In accordance with embodiments, the pixels of the same color in the same column of different rows in the pixel array may be simultaneously selected and subjected to the signal process, thereby leading, to a decrease in a memory area and/or memory usage and the fast sensing timing of the pixels in the sub-sampling mode and the binning mode of the image sensor.

DRAWINGS

The objects and features of the present invention will become apparent from the following description of an embodiment given in conjunction with the accompanying drawings, in which:

FIG. 1 illustrates the operation of an image sensor of the related art in a sub-sampling mode and a binning mode.

Figure 2:
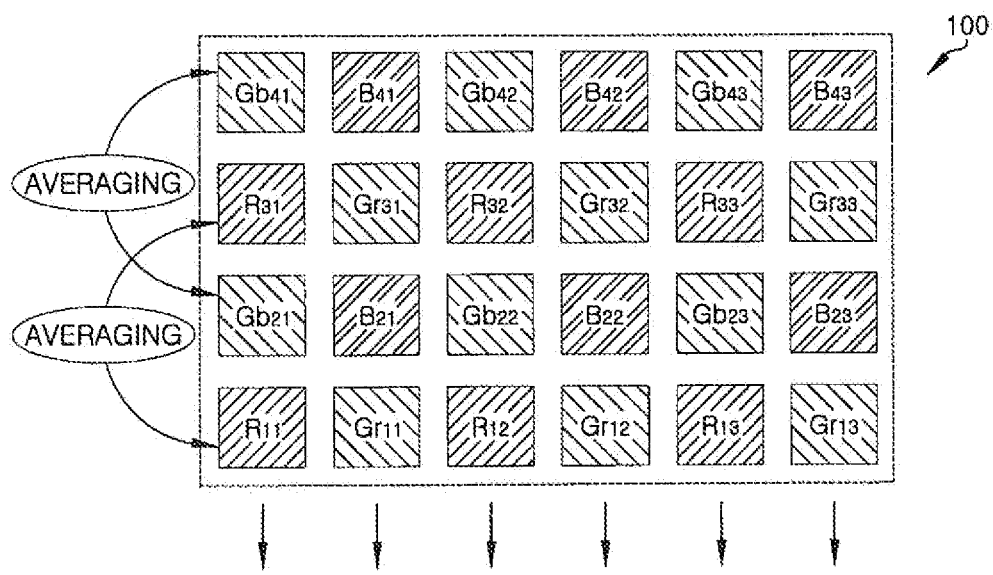

Example FIG. 2 illustrates an image sensor and a row averaging method for an image sensor in a sub-sampling mode and a binning mode in accordance with embodiments.

Figure 3:
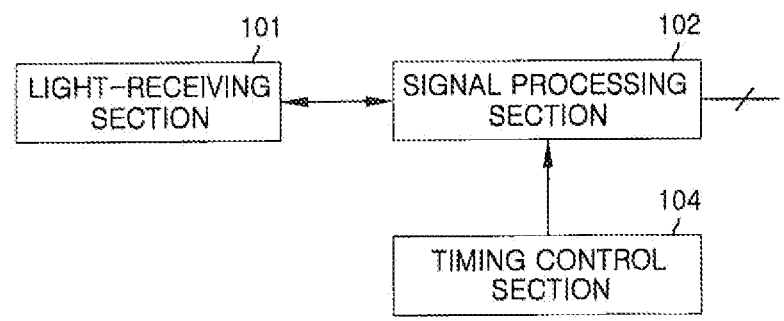

Example FIG. 3 is a functional block diagram illustrating an image sensor capable of performing row averaging with no line memory in accordance with embodiments.

Figure 4:
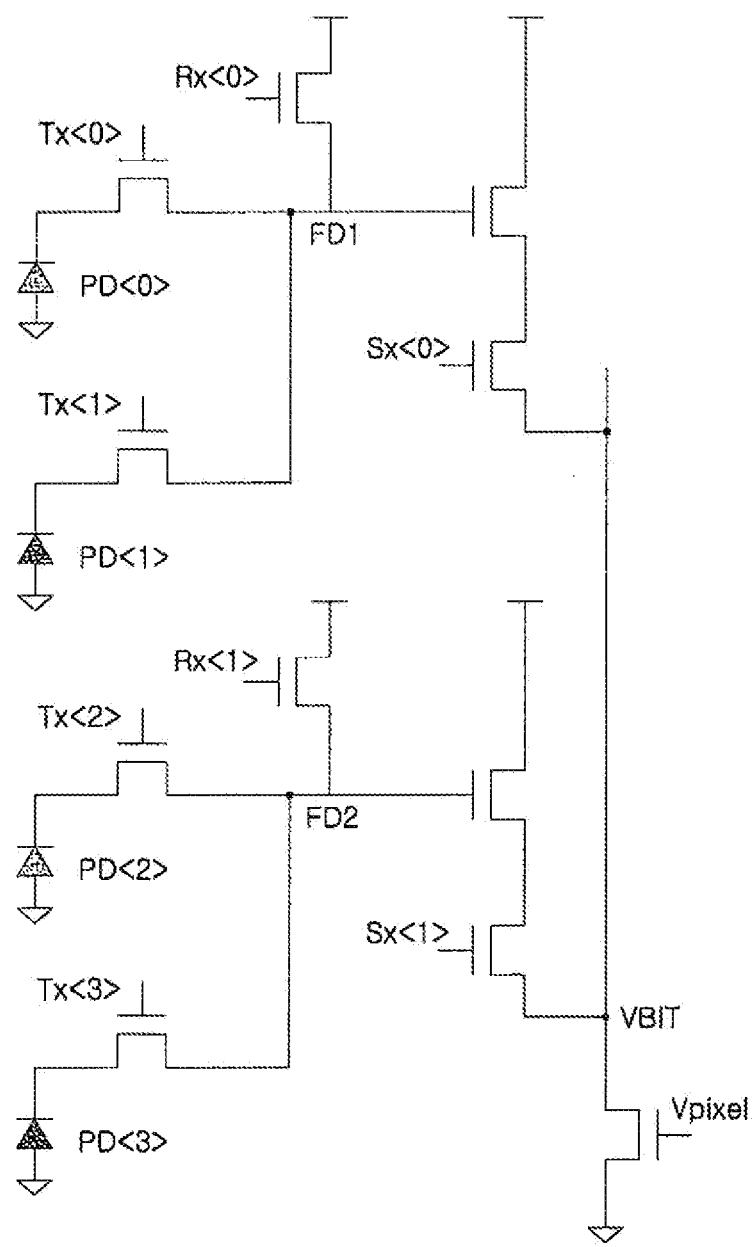

Example FIG. 4 is a detailed circuit diagram of the functional blocks of an image sensor in accordance with embodiments.

Figure 5:
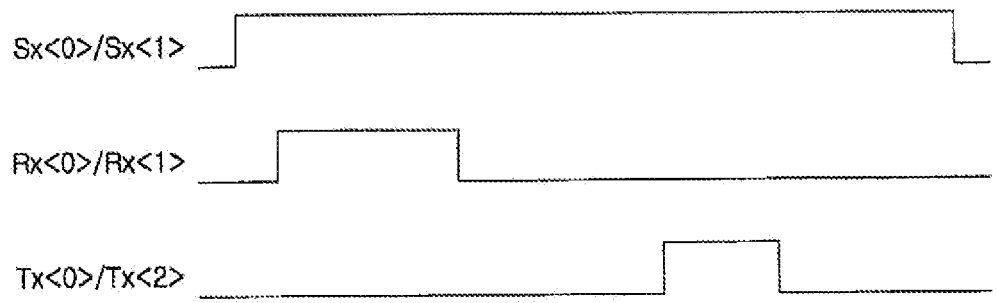

Example FIG. 5 is a control timing waveform chart illustrating row averaging in an image sensor in accordance with embodiments.

Figure 6:
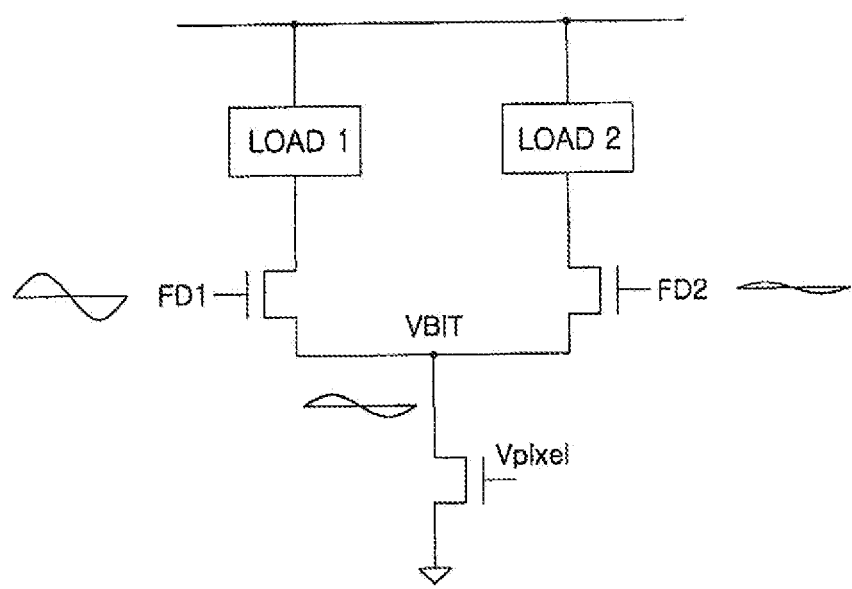

Example FIG. 6 illustrates the final output result of row averaging in an image sensor in accordance with embodiments.

DESCRIPTION

Embodiments will be described herein, and variations of these embodiments may become apparent to those of ordinary skill in the art upon reading the foregoing description. Accordingly, embodiments also include all modifications and equivalents of the subject matter recited in the claims appended hereto as permitted by applicable law.

In the following description of embodiments, if structures and operations are already well established to one of ordinary skill in the art, further detailed description thereof may be omitted.

Further, in embodiments, functions described in the blocks or the sequences may be reversed in order. For example, two successive blocks and sequences may be substantially executed simultaneously or in reverse order according to corresponding functions.

Hereinafter, embodiments will be described in detail with reference to the accompanying drawings which form a part hereof.

Example FIG. 2 illustrates an image sensor and a row averaging method for an image sensor in a sub-sampling mode and a binning mode in accordance with embodiments.

As illustrated in example FIG. 2, in embodiments, the pixel information of the pixels in the first and second rows from among the four total rows in a sub-sampling mode of a pixel array 100, for example, only the pixel information of Gb41-B41-Gb42-B42-Gb43-B43 and R31-Gr31-R32-Gr32-R33-Gr33 are output. In order to minimize noise for the row pixel information to be read in the sub-sampling mode, the read pixel information and the unread pixel information of the pixels in the third and fourth rows, for example, the pixel information of Gb21-B21-Gb22-B22-Gb23-B23 and R11-Gr11-R12-Gr12-R13-Gr13 are added.

At this time, in embodiments, the switching timing of the pixels is controlled such that the pixels of the same color in the same column of different rows in the pixel array 100, for example, the pixels of the odd-numbered first and third rows in the pixel array 100, that is, Gb41 and Gb21 pixels are simultaneously selected and subjected to a signal process.

Similarly, in embodiments, the switching timing of the pixels is controlled such that the pixels of the same color in the same column of different rows in the pixel array 100, for example, the pixels in the even-numbered second and fourth rows in the pixel array 100, that is, R31 and R11 pixels are simultaneously selected and subjected to a signal process.

In embodiments, the switching timing of the pixels is controlled such that the pixels having the same color arrangement in the same color of different rows in the pixel array 100, for example, the pixels in the odd-numbered first and third rows in the pixel array 100, that is, Gb4-B41-Gb42-B42-Gb43-B43 and Gb21-B21-Gb22-B22-Gb23-B23 pixels are simultaneously selected and subjected to the signal process.

Similarly, in embodiments, the switching timing of the pixels is controlled such that the pixels having the same color arrangement in the same column of different rows in the pixel array 100, for example, the pixels in the even-numbered second and fourth rows in the pixel array 100, that is, R31-Gr31-R32-Gr32-R33-Gr33 and R11-Gr11-R12-Gr12-R13-Gr13 pixels are simultaneously selected and subjected to the signal process.

In embodiments, the signal process includes, for example, a step of reading and converting the signals of the pixels.

Example FIG. 3 is a functional block diagram of an image sensor capable of performing row averaging without using a line memory in accordance with embodiments. The image sensor may include a light-receiving unit 101, a signal processing unit 102, and a timing control unit 104.

The light-receiving unit 101 may include a plurality of pixels arranged in a pixel array in rows and columns, such as the pixel array 100. For example, an odd-numbered column may have a structure in which four pixels are repeated in order of G, B, G, and B (G is a green filter, and B is a blue filter), and an even-numbered column may have a structure in which four pixels are repeated in order of R, G, R, and G (R is a red filter).

The signal processing unit 102 reads the pixel signal of the light-receiving unit 101 and performs a signal process. For example, the signal processing unit 102 may be switched under the control of the timing control unit 104 as described below to simultaneously select the pixels (or a plurality of pixels) of the same color (or having the same color arrangement) in the same column of different rows in the pixel array 100 of the light-receiving unit 101 and to perform the signal process including, for example, reading and converting.

The average value of the signals of the pixels having the same color is output through the signal processing unit 102.

The timing control unit 104 may control the switching timing of the signal processing unit 102 such that the light-receiving units of the pixels of the same color in the same column of different rows in the pixel array 100 are simultaneously selected and the signal process is performed.

As shown in example FIG. 4, the signal processing unit 102 which is controlled by the timing control unit 104 may include selection transistors Sx<0> and Sx<1> which simultaneously select the light-receiving units of the pixels (for example, Gb41 and Gb21) of the same color in the pixel array 100, for example, PD<0> and PD<2>, reset transistors Rx<0> and Rx<1> which simultaneously initialize the pixels selected by the selection transistors Sx<0> and Sx<1> in the same column of different rows, and transfer transistors Tx<0> and Tx<2> which simultaneously transfer the signals of the pixels in the same column to a signal detection unit Vpixel in the corresponding column.

Thus, the timing control unit 104 may perform control such that the selection transistors Sx<0> and Sx<1> in different rows are simultaneously turned on to select different rows, the reset transistors Rx<0> and Rx<1> are simultaneously turned on/off to simultaneously initialize the pixels in the same column of different rows, and the transfer transistors Tx<0> and Tx<2> of the pixels in the same column are simultaneously turned on/off to simultaneously transfer the signals of the pixels in the same column to the signal detection unit Vpixel.

Although the pixels of the same color in the same column of different rows have been illustrated in embodiments, it should be noted that a plurality of pixels (for example, Gb41-B41-Gb42-B42-Gb43-B43) having the same color arrangement may also be applied. The operation of the pixels (for example, R31 and R11) of the same color in different rows having different light-receiving units PD<1> and PD<3> is similar to the operation of the pixels Gb41 and Gb21 described above, thus further detailed description thereof will not be repeated.

The characteristics in accordance with embodiments will be specifically described with reference to a control timing waveform chart of example FIG. 5 illustrating row averaging in the image sensor and example FIG. 6 illustrating an output result.

First, the timing control unit 104 may simultaneously turn on the selection transistors Sx<0> and Sx<1> of the signal processing unit 102 to simultaneously select the pixels (for example, Gb41 and Gb21) of the same color in different rows.

Thereafter, the timing control unit 104 may simultaneously turn on/off the reset transistors Rx<0> and Rx<1> of the pixels in the same column of different colors selected by the selection transistors to simultaneously initialize the pixels.

As will be more apparent from example FIG. 6, with this operation, source-follower areas FD1 and FD2 are refreshed, and FD reset noise generated at that time and temporary noise generated in FD1 and FD2 are averaged and output on a bit line voltage (VBIT) node. The output average signal may be stored in a sampling capacitor.

The timing control unit 104 may perform control such that the transfer transistors Tx<0> and Tx<2> of the pixels in the same column are simultaneously turned on/off to simultaneously transfer the signals of the pixels in the same column to the signal detection unit Vpixel. That is, as shown in example FIG. 6, the electric charges of PD<0> and PD<2> move to FD1 and FD2, are converted to a voltage, and are output to VBIT. At this time, noise stored in PD<0> and PD<2> and temporary noise generated in the source-follower areas are averaged and output on the node VB1T.

In accordance with embodiments described above, the pixels of the same color in the same column of different rows in the pixel array may be simultaneously selected and subjected to the signal process, thereby preventing an increase in a memory area and/or memory usage and a decrease in the sensing speed of the pixels in the sub-sampling mode and the binning mode of the image sensor.

While embodiments have been shown and described above, it will be understood by those skilled in the art that various changes and modifications may be made without departing from the scope of the invention as defined in the following claims.

What is claimed is:

1. An image sensor having a pixel array with a plurality of pixels in rows and columns, the image sensor comprising:
    a plurality of light-receiving units in the pixels in the pixel array, each light-receiving unit configured to generate a pixel signal;
    a signal processing unit configured to read and process the pixel signals from the light-receiving units and perform a signal process, the signal processing unit comprising a selection transistor that simultaneously selects pixels of different rows having a same color arrangement, a reset transistor that simultaneously initializes the pixels in a same column and different rows, and a transfer transistor that simultaneously transfers the pixel signals in the same column to a signal detection unit; and
    a timing control unit configured to turn on selection transistors of different rows to select different rows of pixels of the same color in the same column without storing previous information, simultaneously turn on the reset transistors of the different rows in the same column then simultaneously turn off the reset transistors of the different rows in the same column to initialize the corresponding pixels in the same column, then simultaneously turn on the transfer transistors in the same column then simultaneously turn off the transfer transistors in the same column to transfer the pixel signals in the same column to the signal detection unit so as to obtain an average of the pixel signals subjected to the signal process.

2. The image sensor of claim 1, wherein an average value of the pixel signals of the pixels of the same color is output through the signal processing unit.

3. The image sensor of claim 1, wherein the timing control unit is configured to perform control such that selection transistors of different rows are simultaneously turned on to select different rows, reset transistors of the pixels in the same column are simultaneously turned on/off to simultaneously initialize the pixels in the same column of different rows, and transfer transistors of the pixels in the same column are simultaneously turned on/off to simultaneously transfer the signals of the pixels in the same column to a signal detection unit.

4. A row averaging method for an image sensor having a pixel array with a plurality of pixels arranged in rows and columns, the method comprising:
    generating a pixel signal with a light-receiving unit in each pixel;
    simultaneously performing a signal process on pixel signals of pixels of a same color in a same column and different rows in the pixel array without storing previous information so as to obtain an average and outputting an average value of the pixel signals of the pixels, wherein the signal process comprises:
    reading and processing the pixel signals from the light-receiving units,
    simultaneously selecting pixels of different rows having the same color arrangement without storing previous information by turning on selection transistors of different rows of pixels of the same color in the same column,
    simultaneously initialing the pixels in the same column and different rows by simultaneously turning on reset transistors of the different rows in the same column then simultaneously turning off the reset transistors of the different rows in the same column, then
    simultaneously transferring the pixel signals in the same column to a signal detection unit by simultaneously turning on the transfer transistors in the same column then simultaneously turning off the transfer transistors in the same column
    so as to obtain an average of the pixel signals subjected to the signal process.

5. The row averaging method of claim 4, wherein outputting the average value further comprises:
    simultaneously outputting the pixel signals of the pixels in the same column and the different rows.

6. A row averaging method for an image sensor having a pixel array with a plurality of pixels arranged in rows and columns, the method comprising:

generating the pixel signals with light-receiving units, each light-receiving unit comprising a pixel;

simultaneously selecting pixels of a same color in a same column and different rows in the pixel array without storing previous information so as to obtain an average;

performing a signal process on respective pixel signals of the selected pixels of the same color, wherein the signal process comprises:

reading and processing the pixel signals from the light-receiving units, simultaneously selecting pixels of different rows having the same color arrangement without storing previous information by turning on selection transistors of different rows of pixels of the same color in the same column, simultaneously initializing the pixels in the same column and different rows by simultaneously turning on reset transistors of the different rows in the same column then simultaneously turning off the reset transistors of the different rows in the same column, then simultaneously transferring the pixel signals in the same column to a signal detection unit by simultaneously turning on the transfer transistors in the same column then simultaneously turning off the transfer transistors in the same column so as to obtain an average of the pixel signals subjected to the signal process.

7. The row averaging method of claim 6, further comprising:

outputting an average value of the pixel signals.

8. The image sensor of claim 1, wherein each signal processing unit further comprises a floating diffusion area connected to the reset transistor and the transfer transistor of the signal processing unit.

9. The image sensor of claim 8, wherein the floating diffusion area is a source-follower area.

10. The image sensor of claim 8, wherein reset noise and temporary noise in the floating diffusion areas generated during row selecting and/or pixel initializing are averaged.

11. The row averaging method of claim 4, wherein the signal detection unit comprises one of the reset transistors and a corresponding one of the transfer transistors.

12. The row averaging method of claim 11, wherein simultaneously initializing the pixels in the same column and different rows and simultaneously transferring the pixel signals in the same column to the signal detection unit refreshes a floating diffusion area connected to the reset transistor and the transfer transistor of the signal processing unit.

13. The image sensor of claim 12, wherein the floating diffusion area is a source-follower area.

14. The image sensor of claim 12, wherein simultaneously selecting pixels of different rows having the same color arrangement and simultaneously initializing the pixels in the same column and different rows generates reset noise and temporary noise in the floating diffusion areas, and the method averages and outputs the generated reset noise and temporary noise.

15. The row averaging method of claim 6, wherein the signal detection unit comprises one of the reset transistors and a corresponding one of the transfer transistors.

16. The row averaging method of claim 15, wherein simultaneously initializing the pixels in the same column and different rows and simultaneously transferring the pixel signals in the same column to the signal detection unit refreshes a floating diffusion area connected to the reset transistor and the transfer transistor of the signal processing unit.

17. The image sensor of claim 16, wherein the floating diffusion area is a source-follower area.

18. The image sensor of claim 16, wherein simultaneously selecting pixels of different rows having the same color arrangement and simultaneously initializing the pixels in the same column and different rows generates reset noise and temporary noise in the floating diffusion areas, and the method averages and outputs the generated reset noise and temporary noise.

* * * * *